United States Patent [19]

Altenbach

[11] Patent Number: 5,323,339
[45] Date of Patent: Jun. 21, 1994

[54] DIGITAL ANTI-ALIASING FILTER SYSTEM
[75] Inventor: Ronald E. Altenbach, Monterey Park, Calif.
[73] Assignee: Rockwell International Corporation, Seal Beach, Calif.
[21] Appl. No.: 889,942
[22] Filed: Jun. 2, 1992
[51] Int. Cl.$^5$ ............................................. G06F 15/31
[52] U.S. Cl. ............................ 364/724.07; 364/724.16
[58] Field of Search ....................... 364/724.07, 724.16
[56] References Cited

U.S. PATENT DOCUMENTS

| | | | |
|---|---|---|---|
| 4,488,251 | 12/1984 | Wischermann | 364/724.16 |
| 4,621,217 | 11/1986 | Saxe et al. | 364/724.16 |
| 4,872,127 | 10/1989 | Nolan | 364/724.07 |

Primary Examiner—David H. Malzahn
Attorney, Agent, or Firm—Lawrence N. Ginsberg; Charles T. Silberberg

[57] ABSTRACT

A digital preprocessor anti-aliasing filter system for digitally processing input data from a sensor and feeding this processed input data to a primary processor. An analog-to-digital converter is provided for sampling analog input data and converting this input data to digital signals. At least one data processing filter module is provided for receiving the digital signals and processing these signals to filter out selected undesirable frequencies and odd multiples of these frequencies. The filtered output from the filter module is at a sample rate which is substantially an integer multiple of the primary processor sample rate. Therefore, extreme attenuation is provided at these selected undesirable frequencies.

6 Claims, 7 Drawing Sheets

DIGITAL ANTI-ALIASING FILTER SYSTEM

BACKGROUND OF THE INVENTION

1. Field of the Invention

The present invention relates to anti-aliasing filters and more particularly to an anti-aliasing filter system which provides extreme attenuation at selected undesirable frequencies.

2. Description of the Related Art

Sampled analog sensor data presently being employed in digital control systems, such as in aerospace vehicles, will contain erroneous signal information if the sensed signal contains frequencies greater than one-half the sample rate. These erroneous signals can be injected into the sensor data via the sensed parameter or by extraneous noise sources. They can be potentially dangerous by reducing system stability, by causing control systems to track erroneous disturbance signals, or by otherwise degrading the performance of digital processors using the sensor data.

SUMMARY OF THE INVENTION

It is, therefore, a principal object of the present invention to provide an improved anti-aliasing filter system which provides extreme attenuation at selected undesirable frequencies.

Another object is to provide such extreme attenuation with minimum phase lag being introduced by the anti-aliasing process.

Yet another object is to provide such an anti-aliasing filter system which is both simple and inexpensive.

These objects are achieved by the present invention which is a digital preprocessor anti-aliasing filter system for digitally processing input data from a sensor and feeding this processed input data to a primary processor. An analog-to-digital converter is provided for sampling analog input data and converting this input data to digital signals. At least one data processing filter module is provided for receiving the digital signals and processing these signals to filter out selected undesirable frequencies and odd multiples of these frequencies. The filtered output from the filter module is at a sample rate which is substantially an integer multiple of the primary processor sample rate. Therefore, extreme attenuation is provided at these selected undesirable frequencies.

Other objects, advantages and novel features of the present invention will become apparent from the following detailed description of the invention when considered in conjunction with the accompanying drawings.

BRIEF DESCRIPTION OF THE DRAWINGS

FIGS. 4b-c illustrate the end-to-end frequency response characteristics of the present invention.

The same elements or parts throughout the figures are designated by the same reference characters.

DETAILED DESCRIPTION OF THE PREFERRED EMBODIMENTS

Figure 1:
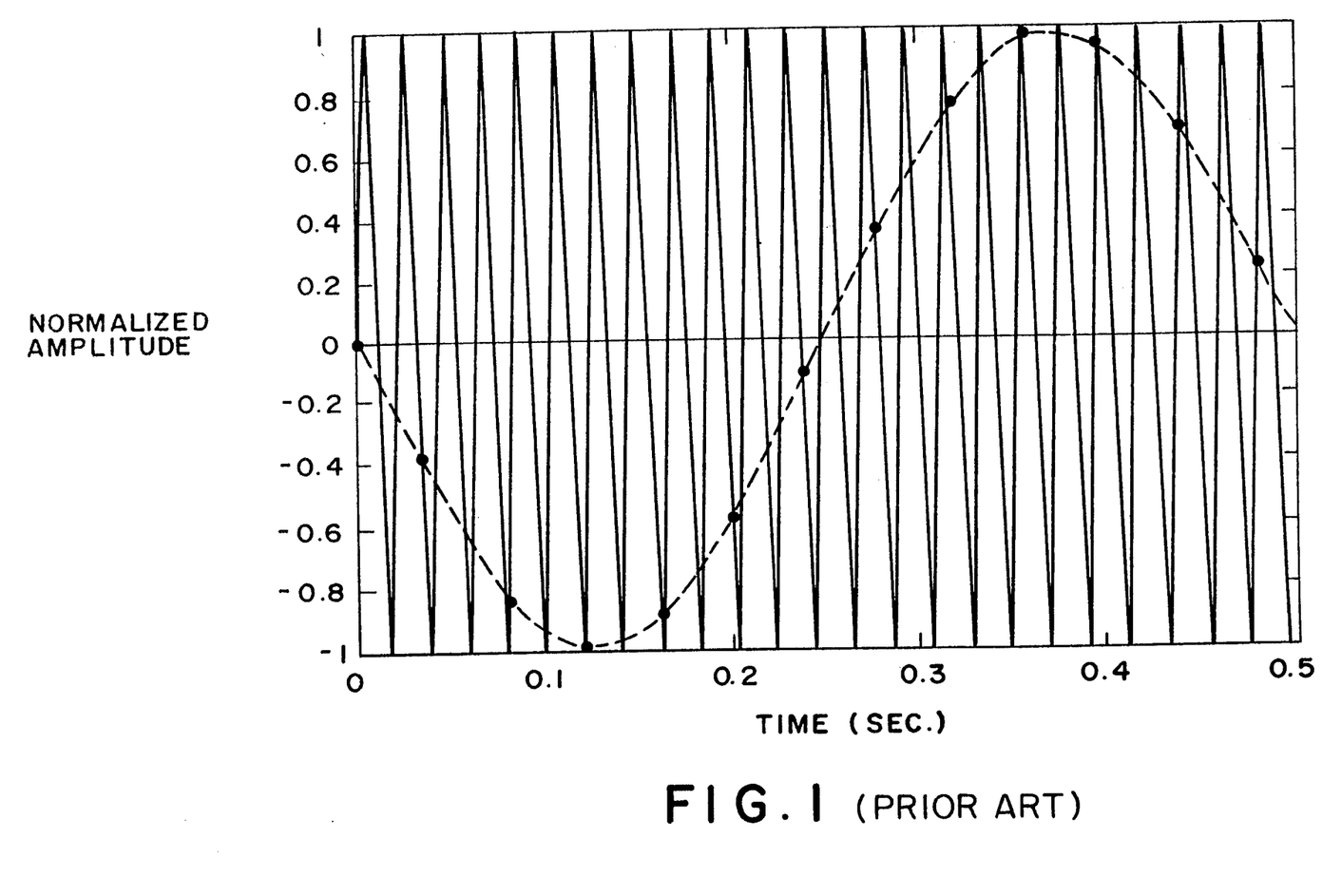
FIG. 1 is a graph of normalized amplitude versus time, illustrating an example of a 48 hertz sinusoid waveform folded to 2 hertz by sampling at 25 samples per second.

Referring to the drawings and the characters of reference marked thereon, FIG. 1 illustrates that sampling a waveform at a sampling frequency less than twice the frequency of the largest frequency present can produce aliasing. In this figure a 48 HZ sinusoid waveform is folded to 2 HZ by sampling at 25 samples per second.

Figure 2:
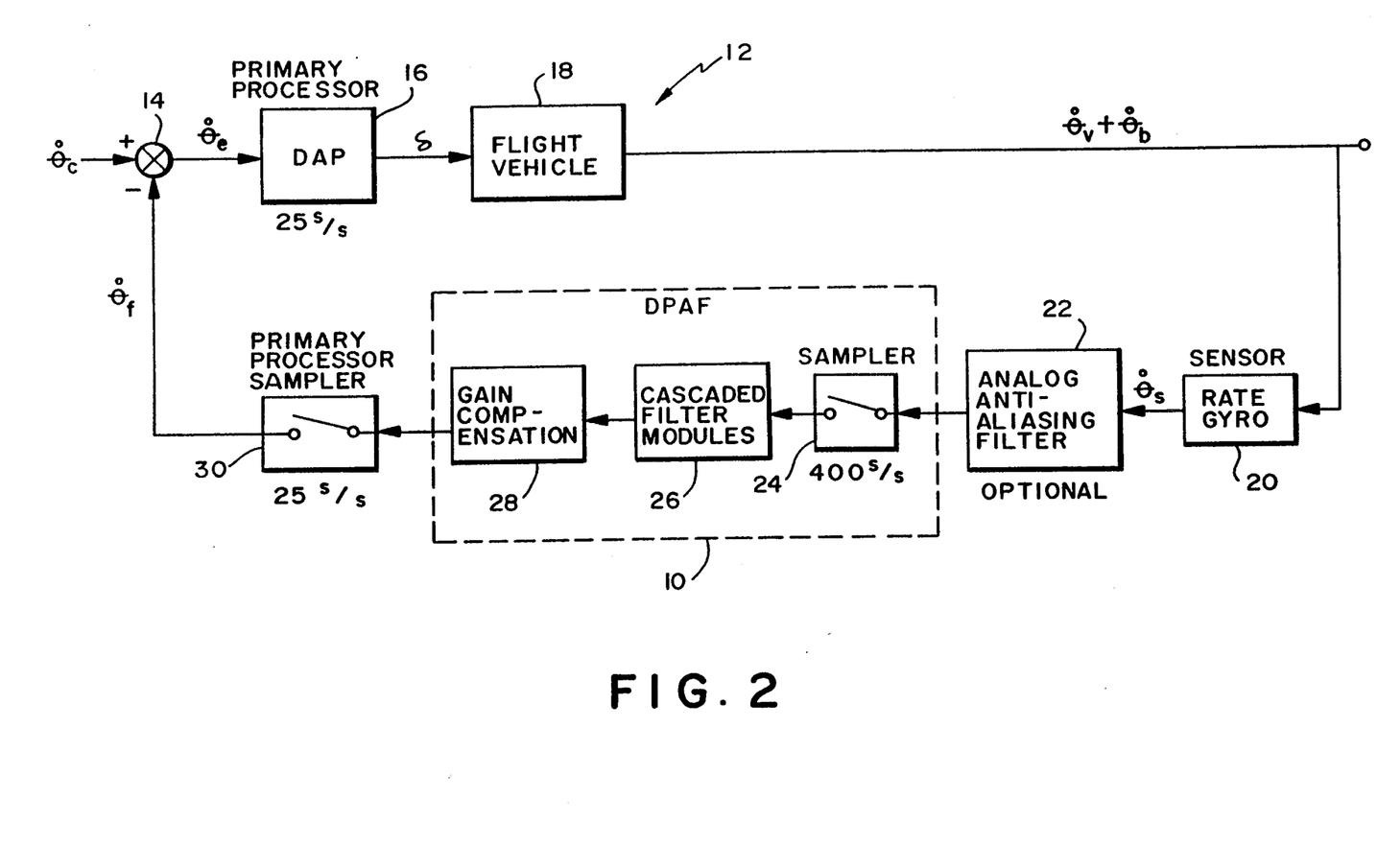
FIG. 2 is a block diagram showing an overall system including an anti-aliasing filter system according to a preferred embodiment of the present invention.

FIG. 2 illustrates the present invention, designated generally as 10, incorporated in a closed loop flight vehicle control system, designated generally as 12. The commanded angular body rate $\dot{\theta}_c$ is summed with the actual vehicle rate feed back signal, $\dot{\theta}_f$, at junction 14. The resulting error signal, $\dot{\theta}_e$, is directed to a primary digital autopilot processor (DAP) 16. The DAP 16 contains the flight control laws, compensation filters and body bending filters. The DAP 16 typically operates at a low sample rate, for example 25 samples/second (S/S), to reduce computing overhead. The output from the DAP 16 directs commands $\delta$ to the flight vehicle 18 actuation systems causing the vehicle to rotate. The output rate from the flight vehicle 18 comprises a desired rigid body vehicle rate ($\dot{\theta}_v$) and an undesirable component of vehicle rate due to body bending ($\dot{\theta}_b$). The flight control system (FCS) rate gyro 20 senses this combined rate $\dot{\theta}_v$ to $\dot{\theta}_b$ and directs its output ($\dot{\theta}_s$) to an optional analog anti-aliasing filter 22. The anti-aliasing filter system 10 of the present invention, therefore, can receive its input from the analog filter 22 or directly from the rate gyro 20.

In this preferred embodiment, the digital preprocessor anti-aliasing filter system (DPAF) comprises a sampler 24, cascaded filter modules 26, and a gain compensation element 28. Sampler 24 includes an analog-to-digital converter for sampling analog input data and converting this input data to digital signals. The sample rate of sampler 24 is an integer multiple of the primary processor sampler 30 and is high enough to provide two samples for each cycle of the highest frequency present in the analog input signal. The filter modules 26 receive these digital signals from the sampler 24 and processes these signals to filter out selected undesirable frequencies and odd multiples of these frequencies. The gain compensation element 28 provides for unity gain for zero frequency and near unity gain for low frequencies.

The output from DPAF 10 is directed to a primary processor sampler 30. Sampler 30 operates at the primary processor 16 sample rate which is an integer submultiple of the DPAF 10 sample rate. Therefore, this sampler 30 acts as an interface between the DPAF 10 and the primary processor 16.

Each filter module discriminates the component of the input signal which is 180° out of phase with the input signal at the frequency selected to be attenuated, and then sums it with the input signal.

Figure 3:
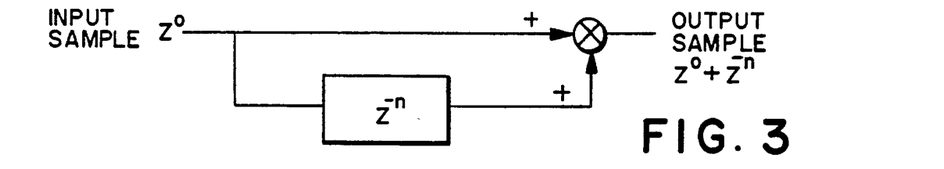
FIG. 3 is a schematic representation of a data processing filter module in accordance with the principles of the present invention.

Referring now to FIG. 3, such a filter module, designated generally as 32, is illustrated. A first filter module has an input ($Z^O$) from the sampler 24. This current sample $Z^O$ is summed with the n th past sample, $Z^{-n}$, to provide the output sample $Z^O + Z^{-n}$. This operation completely eliminates from the output signal the frequency selected for attenuation. It also completely eliminates all odd harmonics of that frequency up to the Nyquist frequency of the preprocessor. The Nyquist frequency is defined as the frequency equal to ½ the sample rate. Therefore, the Nyquist frequency would be 200 hertz for a preprocessor operating at a sample rate of 400 S/S. The filter module operation, however, doubles the magnitude of frequencies in the output signal which are even multiples of the frequency selected for attenuation. It also effectively doubles the magnitude of low frequencies to which a nearly in-phase 360° component of the input signal is being summed with the input signal. This doubling effect can be compensated for by applying a gain of 0.5 to the output of the filter module.

Figure 4A:
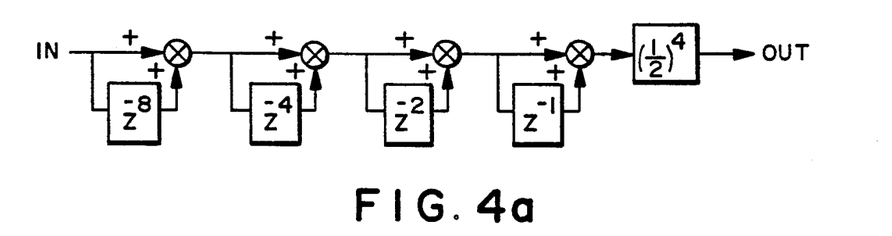
FIG. 4a illustrates the present invention as serially cascaded data processing filter modules.

If the required frequencies to be attenuated were integer multiples of 25 HZ, a single filter module configured to attenuate 25 HZ would provide attenuation at 25, 75, 125 and 175 HZ. A second filter module configured to attenuate 50 HZ would be required to provide attenuation at 50 and 150 HZ. A third and fourth filter module configured to attenuate 100 and 200 HZ respectively would be required to attenuate these frequencies. Such a cascaded arrangement is illustrated in FIG. 4a. The n th past sample determines the frequency which is to be attenuated. Low frequencies which are contained within the input waveform are effectively doubled by this filter module. Each filter module 32 requires a half-gain amplifier in series with the output to insure unity gain at zero frequency. In the cascaded diagram of FIG. 4a, this single gain required for each filter module 32 is shown as a consolidated single gain module as $(\frac{1}{2})^4$.

Note that only a single filter module configured to attenuate 12.5 HZ would be required to provide attenuation at 12.5 HZ and all odd multiples of 12.5 HZ up to the Nyquist frequency of the preprocessor.

The preferred design equation for the filter module 32 of the present invention is:

$$n = PSR/(2*f),$$

where:
n is the n th past value of the input signal,
PSR is the sample rate of the preprocessor in samples per second, and
f is frequency in HZ to be attenuated.

The value of n for attenuation frequencies of 25, 50, 100 and 200 HZ for a preprocessor operating at a sample rate of 400 S/S is therefore 8, 4, 2 and 1, respectively.

The Amplitude Compensation Gain Factor, k is equal to $(\frac{1}{2})^N$ where N is the number of cascaded Filter Modules. This Gain is applied as a single gain factor in series with the cascaded Filter Modules.

Figure 4B:
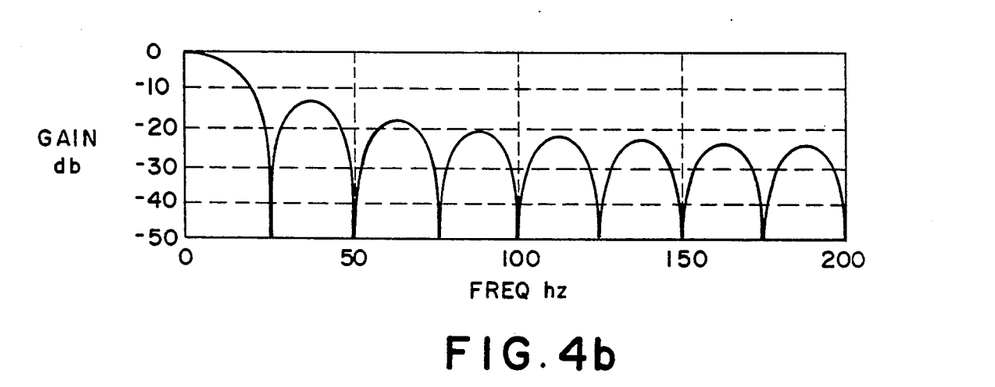
FIG. 4b is a graph of gain (20*log (output/input)) versus frequency (hz).
Figure 4C:
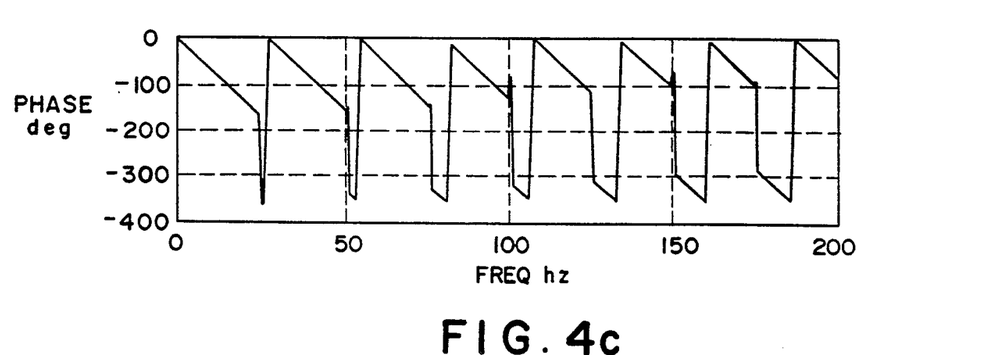
FIG. 4c is a graph of phase (degrees) versus frequency (hz).

FIGS. 4b and 4c illustrate the frequency response characteristics for a system having the following parameters:

| | |
|---|---|
| Primary Processor sample rate | 25 S/S |
| Preprocessor sample rate | 400 S/S |
| Attenuation frequencies | Integer multiples of 25 HZ; 25, 50, 100 and 200 HZ. |

FIG. 4b illustrates the gain in decibels computed as 20 times the log of output over input.

FIG. 4c shows the phase lag in degrees. Note that as desired, all integer multiples of 25 HZ are highly attenuated through the Nyquist frequency of 200 HZ. (Although the attenuation at integer multiples of 25 HZ is effectively infinite, the computer program and plotting routine used to plot the gain plot was limited to the 50 db gain.)

Figure 5:
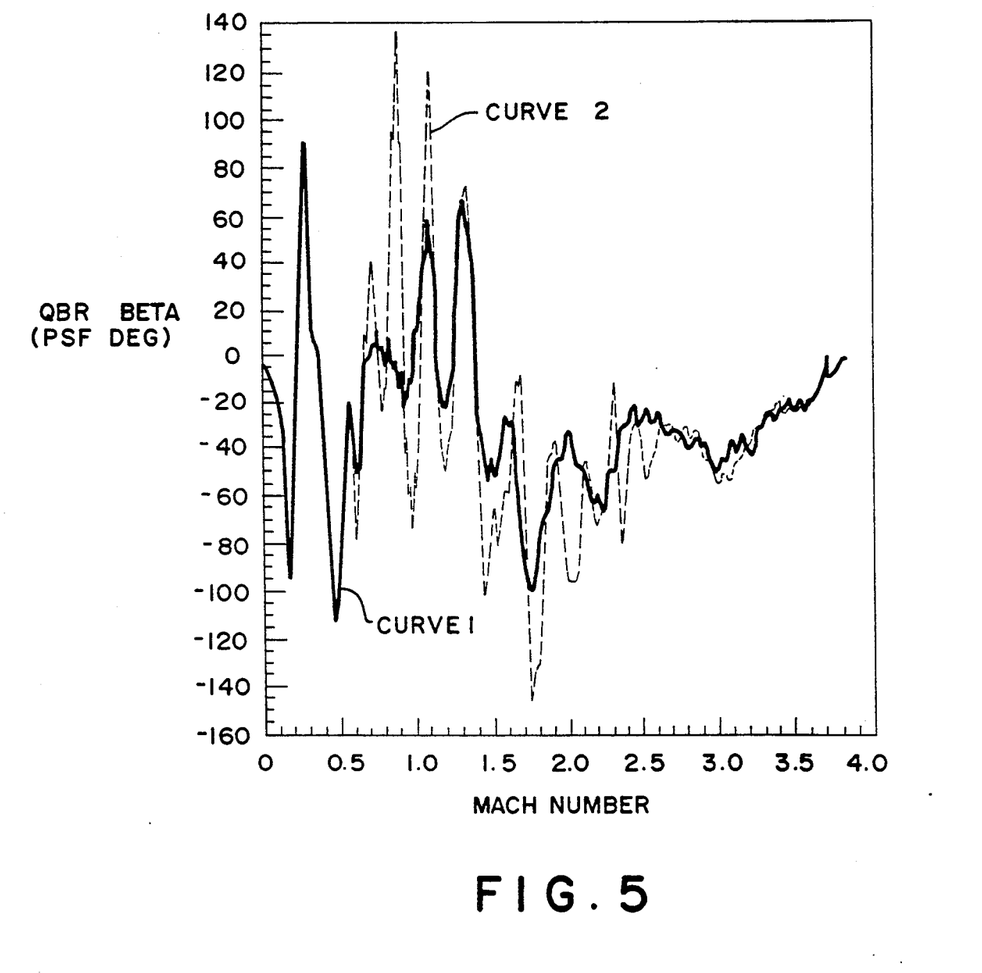
FIGS. 5-8 are graphs derived from recorded signals from Flight Control flight test rate gyro's located in the Shuttle Orbiter during the STS-33 test flight, and from post flight trajectory simulations using these signals. These figures illustrate the potential adverse affects that aliasing can have on space vehicle aerodynamic loads, safety, subsystems design, and cost.

FIG. 5 is a graph of the yaw axis aerodynamic load indicator (dynamic pressure * angle of sideslip) versus mach number, illustrating the adverse affects of aliasing on space shuttle aerodynamic loads, and alternatively, the aerodynamic load improvements achieved by the present invention. Curve 1 describes the load indicator profile for a nominal trajectory, and is representative of the performance achievable with the preferred embodiment. Curve 2 (broken lines) shows the loads indicator profile the shuttle would have flown if it had been flying with rate data from the flight test yaw rate gyros, which because of their unfavorable location in the shuttle vehicle, contained structural bending frequencies up to 125 hertz. As can be seen from the figure, curve 2 exhibits significantly larger aerodynamic load peaks than curve 1. This is solely due to frequency aliasing caused by sampling the flight test gyros signals at the 25 samples per second sample rate of the Shuttle ascent digital autopilot.

Figure 6:
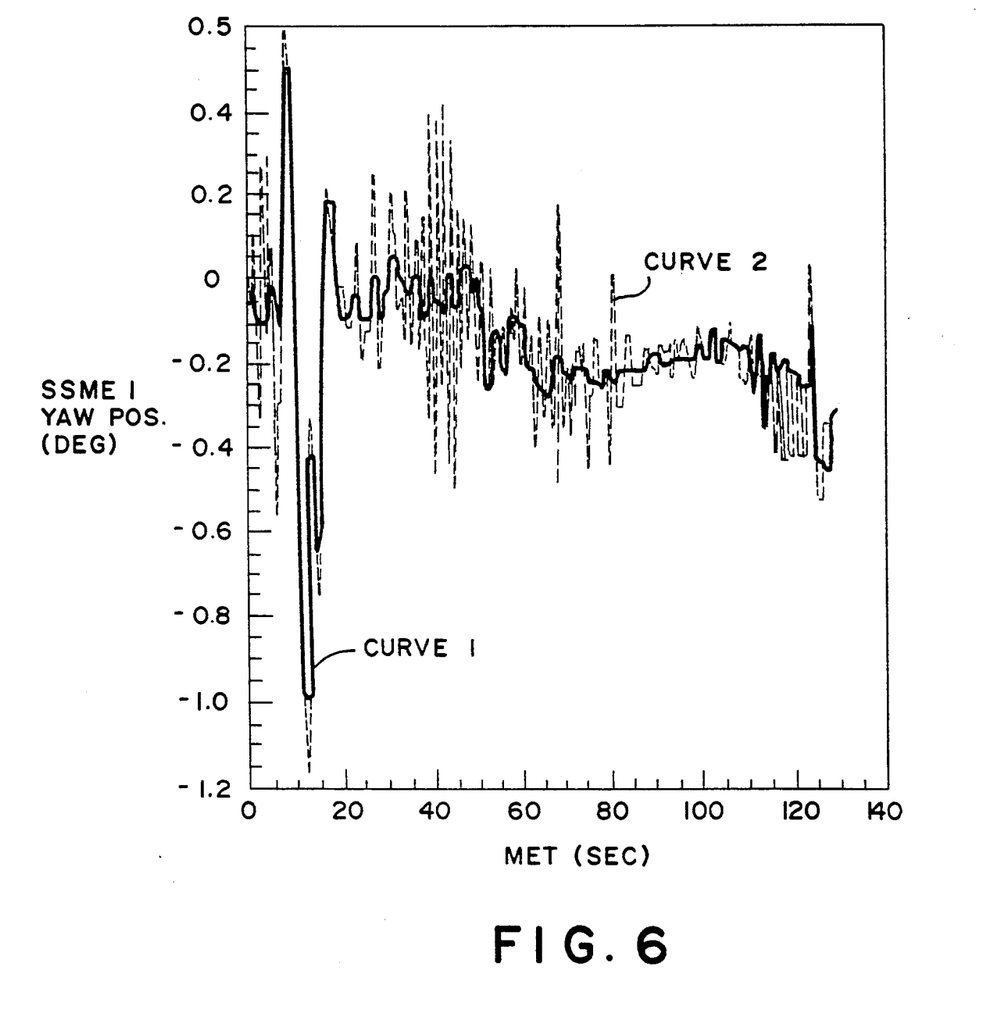

FIG. 6 is a graph of the main engine number 1 yaw actuator position showing increased deflections (deg) caused by aliasing. A significant increase iii actuator deflection activity and magnitude, is apparent in curve 2. This increased cycling at larger magnitudes will increase hydraulic system power requirements and will decrease both hydraulic system and actuator life.

Figure 7:
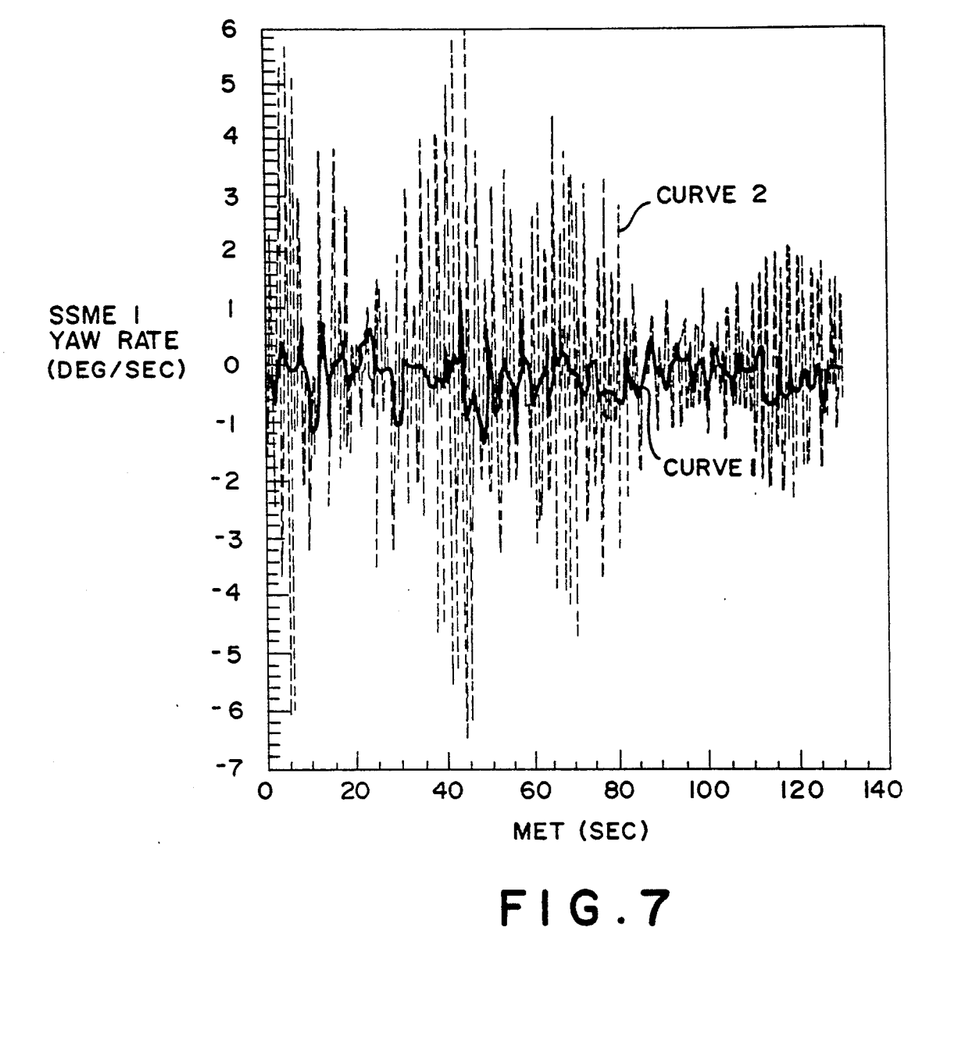

FIG. 7 is a graph of the main engine number 1 yaw actuator rate (deg/sec—time derivative of FIG. 6 data) illustrating the increased actuator rates required to follow the greater deflections caused by aliasing, thereby increasing hydraulic system size, weight and cost.

Figure 8:
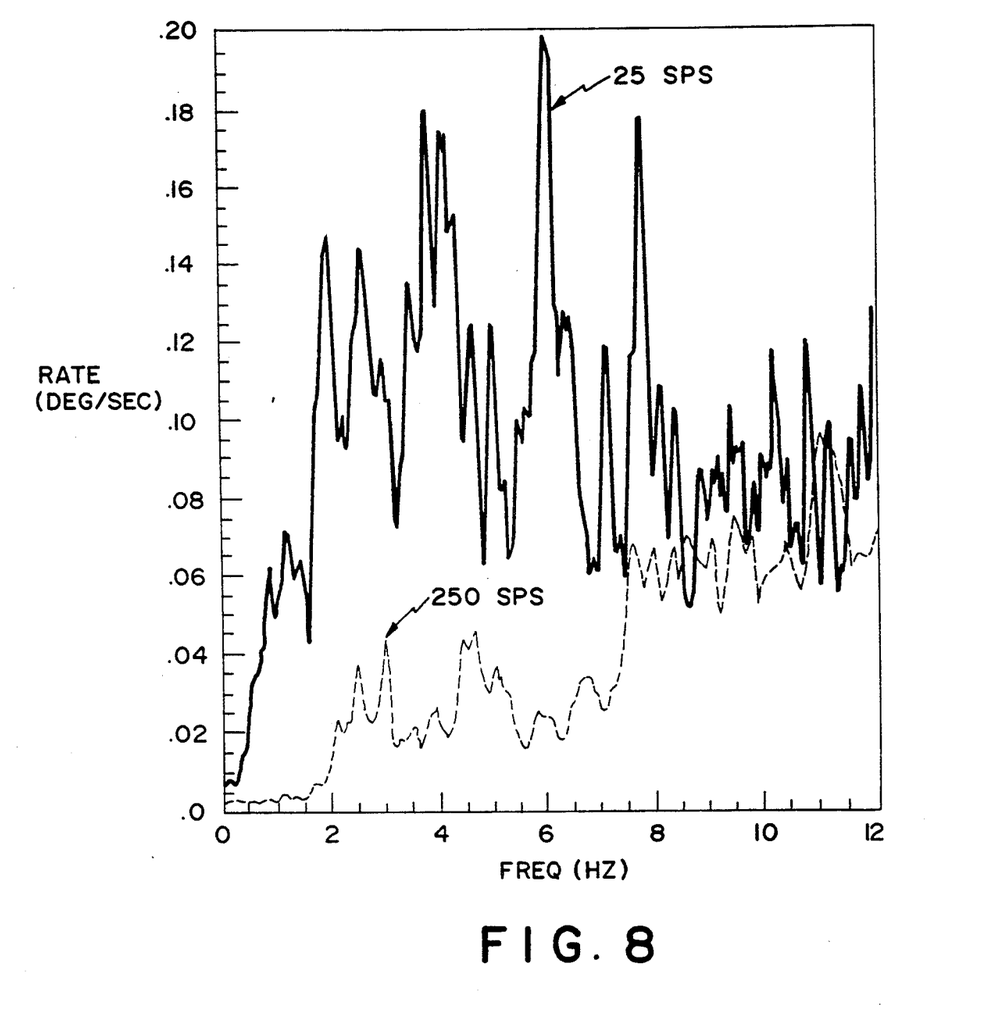

FIG. 8 is a graph of the frequency spectrum of the yaw rate gyro liftoff data illustrating the effects of aliasing in the frequency domain. The true frequency spectrum contained in the gyro data is shown by the 250 sample per second (sps) curve. This is because the raw analog gyro data contains frequencies up to 125 hz. Sampling the same raw analog gyro data at 25 sps provides the erroneous 25 sps curve. This curve is erroneous because all frequencies above 12.5 hertz will get aliased back into the 0-12.5 hertz passband. The true power spectrum of the frequency content can be greatly exaggerated by aliasing as can be seen by comparing the 250 sps curve with the 25 sps curve in the vicinity of 6 hertz. Note that there is approximately an order of magnitude difference (0.2 vs 0.02 deg/sec) between the 25 and 250 sps curves around 6 hertz.

Obviously many modifications and variations of the present invention are possible in light of the above teachings. It is therefore to be understood that, within the scope of the appended claims, the invention may be practiced otherwise than as specifically described.

What is desired to be claimed by Letters Patent of United States is:

1. A digital anti-aliasing filter system for digitally processing input data from a sensor and feeding this processed input data to a primary processor, comprising:
   a) a sensor;
   b) an analog-to-digital converter for sampling analog input data from said sensor and converting this input data to digital signals;
   c) a primary processor operating at a given sample rate; and
   d) a preprocessor comprising at least one data processing filter module for receiving said digital signals and processing these signals to filter out at least one selected undesirable frequency and odd multiples of said at least one frequency prior to being fed to said primary processor, the filtered output from said at least one filter module being at a sample rate which is substantially an integer multiple of said sample rate of said primary processor, said integer multiple not being one, said filter module providing extreme attenuation at said at least one selected undesirable frequency.

2. The anti-aliasing filter system of claim 1, wherein said at least one data processing filter module comprises a plurality of serially cascaded data processing filter modules for providing desired end-to-end filtering characteristics of said filter system.

3. The anti-aliasing filter system of claim 2, wherein each of said data processing filter modules comprises means for summing a current digital signal, $Z^0$, with an $n^{th}$ past sample, $Z^{-n}$, for providing an output sample, $Z^0+Z^{-n}$, for input to the next serially cascaded data processing filter module.

4. A digital anti-aliasing filter system for digitally processing input data from a sensor and feeding this processed input data to a primary processor, comprising:
   a) a sensor;
   b) a primary processor operating at a given sample rate; and,
   c) a preprocessor comprising:
      i) a sampler comprising an analog-to-digital converter for sampling analog input data from a sensor and converting this input data to digital signals;
      ii) at least one data processing filter module for receiving said digital signals and processing these signals to filter out at least one selected undesirable frequency and odd multiples of said at least one frequency prior to being fed to said primary processor, the filtered output from said at least one filter module being at a sample rate which is substantially an integer multiple of said sample rate of said primary processor, said integer multiple not being one, said filter module providing extreme attenuation at said at least one selected undesirable frequency; and
      iii) a gain compensation element for receiving the output of said at least one data processing filter module and for providing unity gain at zero frequency and approximately unity gain for low frequencies of said input data.

5. A digital preprocessor anti-aliasing filter system for use in a closed loop flight vehicle control system of the type in which a commanded angular body rate ($\dot{\theta}_c$) is summed with the actual vehicle rate feedback signal ($\dot{\theta}_f$), the resulting error signal ($\dot{\theta}_e$) being directed to a primary digital autopilot processor (DAP), said primary processor operating at a given sample rate, the output of the DAP directing commands ($\delta$) to a flight vehicle's actuation systems, the output rate from the flight vehicle having a desired rigid body vehicle rate ($\dot{\theta}_v$) and a component of vehicle rate due to body bending ($\dot{\theta}_b$), a flight control system (FCS) rate gyro sensing this combined rate $\dot{\theta}_v+\dot{\theta}_b$ and directing its output rate ($\dot{\theta}_s$) to said digital preprocessor anti-aliasing filter system via an analog anti-aliasing filter to said digital preprocessor anti-aliasing filter system, said digital preprocessor anti-aliasing filter system, comprising:
   a) a sampler comprising an analog-to-digital converter for sampling said output rate ($\dot{\theta}_s$) from said rate gyro and converting this data ($\dot{\theta}_s$) to digital signals;
   b) at least one data processing filter module for receiving said digital signals and processing these signals to filter out at least one selected undesirable frequency and odd multiples of said at least one frequency prior to being fed to said primary processor, the filtered output from said at least one filter module being at a sample rate which is substantially an integer multiple of said primary processor sample rate, said integer multiple not being one, said filter module providing extreme attenuation at said at least one selected undesirable frequency; and
   c) a gain compensation element for receiving the output of said at least one data processing filter module and for providing unity gain for low frequencies, the output of said gain compensation element being said $\dot{\theta}_f$ of the closed loop flight vehicle control system.

6. A digital preprocessor anti-aliasing filter system for use in a closed loop flight vehicle control system of the type in which a commanded angular body rate ($\dot{\theta}_c$) is summed with the actual vehicle rate feedback signal ($\dot{\theta}_f$), the resulting error signal ($\dot{\theta}_e$) being directed to a primary digital autopilot processor (DAP), said primary processor operating at a given sample rate, the output of the DAP directing commands ($\delta$) to a flight vehicle's actuation systems, the output rate from the flight vehicle having a desired rigid body vehicle rate ($\dot{\theta}_v$) and a component of vehicle rate due to body bending ($\dot{\theta}_b$), a flight control system (FCS) rate gyro sensing this combined rate $\dot{\theta}_v+\dot{\theta}_b$ and directing its output rate to said digital preprocessor anti-aliasing filter system via an analog anti-aliasing filter to said digital preprocessor anti-aliasing filter system, said digital preprocessor anti-aliasing filter system, comprising:
   a) a sampler comprising an analog-to-digital converter for sampling said output rate ($\dot{\theta}_s$) from said rate gyro via said analog anti-aliasing filter and converting this data ($\dot{\theta}_s$) to digital signals;
   b) at least one data processing filter module for receiving said digital signals and processing these signals to filter out at least one selected undesirable frequency and odd multiples of said at least one frequency prior to being fed to said primary processor, the filtered output from said at least one filter module being at a sample rate which is substantially an integer multiple of said primary processor sample rate, said integer multiple not being one, said filter module providing extreme attenuation at said at least one selected undesirable frequency; and
   c) a gain compensation element for receiving the output of said at least one data processing filter module and for providing unity gain for low frequencies, the output of said gain compensation element being said $\dot{\theta}_f$ of the closed loop flight vehicle control system.

* * * * *